United States Patent
Yoshinaka

[19]

[11] Patent Number: 5,877,657
[45] Date of Patent: Mar. 2, 1999

[54] PLL CLOCK GENERATOR HAVING TRIMMABLE FREQUENCY DIVIDERS

[75] Inventor: Masanori Yoshinaka, Kanagawa, Japan

[73] Assignee: Ricoh Company, Ltd., Tokyo, Japan

[21] Appl. No.: 979,880

[22] Filed: Nov. 12, 1997

[30] Foreign Application Priority Data

Nov. 29, 1996 [JP] Japan .................................. 8-335128

[51] Int. Cl.⁶ .................................................. H03L 7/18
[52] U.S. Cl. .............................. 331/16; 331/25; 377/29; 377/110
[58] Field of Search .............................. 331/14, 16, 25; 327/156, 157, 160; 377/110, 29

[56] References Cited

U.S. PATENT DOCUMENTS

| | | | |
|---|---|---|---|
| 4,654,859 | 3/1987 | Kung et al. | 331/1 A |
| 5,036,216 | 7/1991 | Hohmann et al. | 309/269 |
| 5,244,836 | 9/1993 | Lim | 437/192 |
| 5,339,050 | 8/1994 | Llewllyn | 331/16 |
| 5,420,545 | 5/1995 | Davis et al. | 331/16 |
| 5,641,701 | 6/1997 | Fukuhara et al. | 438/6 |

FOREIGN PATENT DOCUMENTS

| | | |
|---|---|---|
| 5259290 | 8/1993 | Japan . |
| 61792 | 5/1994 | Japan . |
| 770599 | 7/1995 | Japan . |
| 8274180 | 10/1996 | Japan . |
| 8335674 | 12/1996 | Japan . |

OTHER PUBLICATIONS

Abstract of Japanese Publication No. 63–48838 (Mar. 1, 1988).
Abstract of Japanese Publication No. 59–124741 (Jul. 18, 1984).

Primary Examiner—Siegfried H. Grimm
Attorney, Agent, or Firm—Cooper & Dunham LLP

[57] ABSTRACT

A reference clock signal oscillator generates a reference clock signal. A first programmable counter performs frequency dividing on the reference clock signal and outputs a reference signal resulting-from the frequency dividing. A voltage controlled oscillator generates an output clock signal, the frequency of which is controllable by input voltage control. A second programmable counter performs frequency dividing on the output clock signal and outputs a feedback signal resulting from the frequency dividing. A phase comparator compares the reference signal and the feedback signal, and outputs a phase difference signal which is based on the phase difference between the phases of the reference signal and the feedback signal. A driving circuit includes a charge pump and a loop filter and generates a signal to be applied to the voltage controlled oscillator based on the phase difference signal and performs filtering on the signal to be applied to the voltage controlled oscillator. At least one trimming switch unit determines, by trimming, the frequency dividing ratio of at least one of the first and second programmable counters.

6 Claims, 6 Drawing Sheets

PLL CLOCK GENERATOR HAVING TRIMMABLE FREQUENCY DIVIDERS

BACKGROUND OF THE INVENTION

1. Field of the Invention

The present invention relates to a clock generator in which a clock signal is generated by a PLL oscillation circuit.

2. Description of the Related Art

In the related art, as shown in FIG. 1, in a clock generator 100, a crystal oscillator 20 generates a reference clock signal. A programmable counter 11 performs frequency dividing on the reference clock signal. A VCO (Voltage Controlled Oscillator) 18, in which the output frequency is changeable by input voltage control, generates an output clock signal. A programmable counter 12 performs frequency dividing on the output clock signal. A phase comparator 16 compares the phases of the outputs of the programmable counters 11 and 12 with one another, and detects whether one phase advances from the other phase, whether the one phase delays from the other phase or whether the two phases are coincident with one another. Then, the phase comparator 16 outputs a phase advance signal, a phase delay signal and a phase coincident signal, appropriately. A driving circuit 17 includes a charge pump which determines the voltage to be applied to the VCO 18 based on the signal (the phase advance signal, phase delay signal or phase coincident signal) output from the phase comparator 16. The driving circuit 17 also includes a loop filter which performs filtering on the output of the charge pump.

In operation, when the phase of the output of the programmable counter 12 delays from the phase of the output of the programmable counter 11, the phase comparator 16 sends the phase delay signal to the driving circuit 17. Thereby, the driving circuit 17 raises the voltage to be applied to the VCO 18. As a result, the output frequency of the VCO 18 increases.

When the phase of the output of the programmable counter 12 advances from the phase of the output of the programmable counter 11, the phase comparator 16 sends the phase advance signal to the driving circuit 17. Thereby, the driving circuit 17 lowers the voltage to be applied to the VCO 18. As a result, the output frequency of the VCO 18 decreases.

When the phase of the output of the programmable counter 12 is coincident with the phase of the output of the programmable counter 11, the phase comparator 16 sends the phase coincident signal to the driving circuit 17. Thereby, the driving circuit 17 fixes the voltage to be applied to the VCO 18. As a result, the output frequency of the VCO 18 is fixed.

In the above-described arrangement, the frequency $f_1$ of the clock signal output from the clock generator can be expressed as follows:

$$f_1 = f_0 \times N/M$$

where $f_0$ represents the frequency of the above-mentioned reference clock signal, M represents the frequency dividing ratio of the programmable counter 11 and N represents the frequency dividing ratio of the programmable counter 12.

In the clock generator 100 shown in FIG. 1, data is stored in mask ROMs 103, 104, or programmable memories such as EEPROMs or RAMs. Then, the stored data is used for determining the frequency dividing ratios of the programmable counters 11 and 12. Thus, the programmable counters 11 and 12 are programmed.

It is also possible that, as in a clock generator 101, shown in FIG. 2, an external microprocessor 105, or the like, programs the programmable counters 11 and 12, and thus, the frequency dividing ratios of the programmable counters 11 and 12 are determined.

In such a clock generator in the related art, which is formed in an IC (Integrated Circuit), as means for determining the frequency of the output clock signal, it is necessary to use mask ROMs, EEPROMs or RAMs, or to input control signals externally from a microprocessor or the like.

In a case of using mask ROMs, masks to be used therein are expensive. Thus, a high initial cost is required and the IC of the clock generator is expensive. Further, because a process of programming data for determining the output frequency of the clock generator is performed during a wafer process, considerable time is required for producing an IC including the clock generator which generates a clock signal of a desired frequency.

In a case of using EEPROMs or RAMs, it is necessary to input a signal externally for programming the storage device. In this case, operation is complicated and it is difficult to increase productivity. Further, it is necessary to provide extra terminals for inputting the signal on the IC. Thereby, it is not possible to miniaturize the IC chip.

In a case of inputting a control signal externally from a microprocessor or the like, it is necessary to provide extra terminals for inputting the control signal to the IC. Thereby, it is not possible to miniaturize the IC chip. Further, it is not possible that a clock signal for a microprocessor is provided by the clock generator, because the microprocessor should provide the control signal to the clock generator for causing the clock generator to generate the clock signal.

SUMMARY OF THE INVENTION

The present invention has been devised in order to solve the above-mentioned problems in the related art. An object of the present invention is to provide a low-cost clock generator, an IC chip of which can be miniaturized as a result of eliminating extra terminals, and the frequency dividing ratio setting of which can be freely performed.

In order to achieve the above-mentioned object, a clock generator according to the present invention comprises:

a reference clock signal oscillator for generating a reference clock signal;

a first programmable counter for performing frequency dividing on the reference clock signal and outputting a reference signal resulting from the frequency dividing;

a voltage controlled oscillator for generating an output clock signal, the frequency of which is controllable by input voltage control;

a second programmable counter for performing frequency dividing on the output clock signal and outputting a feedback signal resulting from the frequency dividing; and a phase comparator for comparing the reference signal and the feedback signal, and outputting a phase difference signal which is based on the phase difference between the phases of the reference signal and the feedback signal, driving means, which includes a charge pump and a loop filter, for generating a signal to be applied to the voltage controlled oscillator based on the phase difference signal and performing filtering on the signal to be applied to the voltage controlled oscillator; and at least one trimming switch means for determining, by trimming, the frequency dividing ratio of at least one of the first and second programmable counters.

The at least one trimming switch means may comprise fuse trimming elements or laser trimming elements.

In the clock generator according to the present invention, it is easy to set desired circuits for determining the frequency dividing ratios of the programmable counters in order to determine the frequency of the output signal of the clock generator, by cutting unnecessary fuses of the fuse trimming elements by fusion or by cutting unnecessary elements of the switching arrays of the laser trimming elements. Accordingly, it is not necessary to provide extra terminals for inputting the signal on the IC of the generator, except terminals for the fuse trimming in a case where the fuse trimming is applied. However, these terminals for the fuse trimming are necessary only when the fuse trimming is performed. Accordingly, it is not necessary to connect wires permanently to these terminals and draw the wires externally for use by customers. Therefore, it is sufficient that these terminals are very small and it is not necessary to provide extra circuits such as surge protection circuits for these terminals. As a result, the IC chip of the clock generator can be miniaturized. In contrast to this, in the related art, external memories (such as EEPROMs, RAMs or the like) or an external microprocessor which are connected externally of the IC of the clock generator are used and programming of the programmable counters is performed using external signals. Accordingly, in the related art, it is necessary to provide permanent extra terminals to the IC of the clock generator for programming the programmable counters. As a result, in the related art, it is difficult to miniaturize the IC of the clock generator.

Further, because it is not necessary to produce new masks for mask ROMs in the present invention, which is necessary in the case of FIG.1, it is possible to reduce the cost for the IC of the clock generator and the cost for development of the IC of the clock generator.

Further, the frequency of the output clock signal of the clock generator can be set easily by the trimming so as to determine the frequency dividing ratios of the programmable counters. Therefore, the clock generator design can be freely performed. Further, because the trimming operation is easy, productivity of the clock generator is improved, and thus, cost of the clock generator can be reduced. Further, it is possible to provide a clock signal for an external microprocessor. (In the method shown in FIG.2, it is not possible for the clock generator 101 to provide a main clock signal to the microprocessor 105.)

A clock generator manufacturing method according to the-present invention comprises the steps of:

a) forming, on a wafer, a first programmable counter for performing frequency dividing on a reference clock signal which is generated by a reference clock signal oscillator, a first trimming switch means for determining, by trimming, the frequency dividing ratio of the first programmable counter, a voltage controlled oscillator for generating an output clock signal, the frequency of the output clock signal being controllable by input voltage control, a second programmable counter for performing frequency dividing on the output clock signal, a second trimming switch means for determining, by trimming, the frequency dividing ratio of the second programmable counter, a phase comparator for comparing the outputs of the first and second programmable counters and generating a phase difference signal, a charge pump for generating a voltage to be applied to the voltage controlled oscillator based on the phase difference signal, and performing filtering on the voltage to be applied to the voltage controlled oscillator; and b) performing the trimming of the first and second trimming switch means after the step a).

In this manufacturing method, the frequency of the output clock signal of the clock generator is set by trimming after the wafer process (the above-mentioned step a)). Accordingly, it is possible to effectively shorten the manufacturing process or development process of the clock generator. Further, adjustment of the frequency of the output clock signal of the clock generator can be freely performed by the trimming.

Further, because the trimming operation is easy, productivity of the clock generator is improved, and thus, it is possible to manufacture the low-cost high-performance clock generator.

Other objects and further features of the present invention will become more apparent from the following detailed description when read in conjunction with the accompanying drawings.

DETAILED DESCRIPTION OF THE PREFERRED EMBODIMENTS

Figure 1:
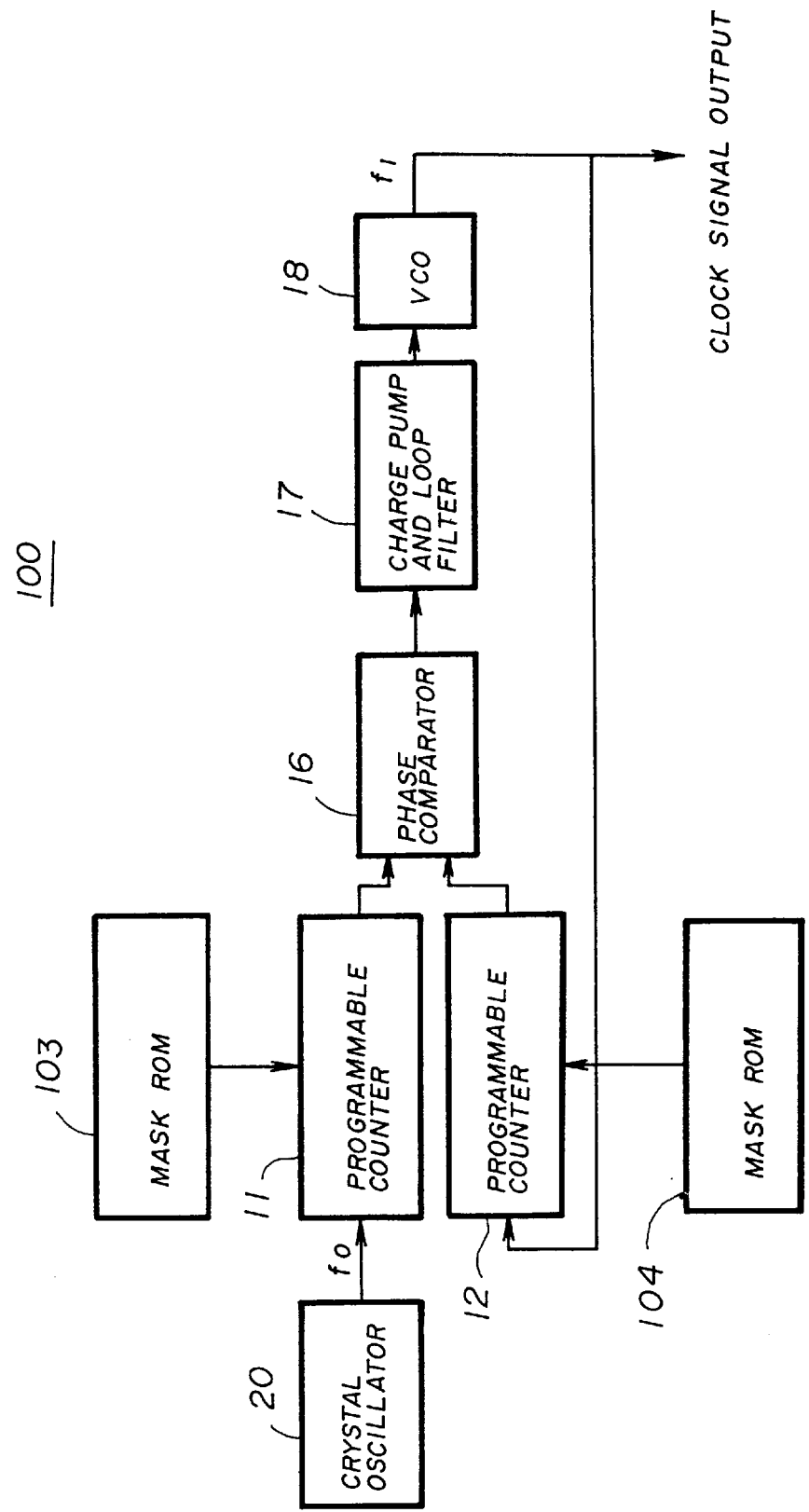
FIG. 1 shows a block diagram of an example of a clock generator in the related art.
Figure 2:
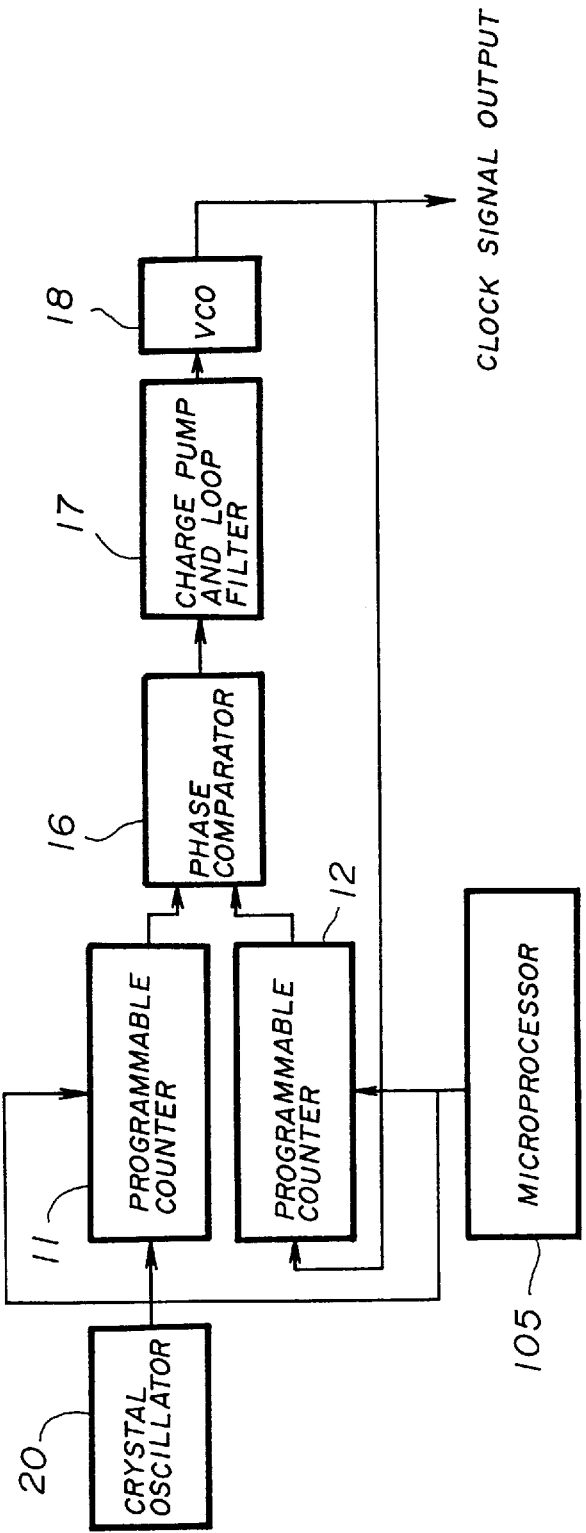
FIG. 2 shows a block diagram of another example of a clock generator in the related art.
Figure 3:
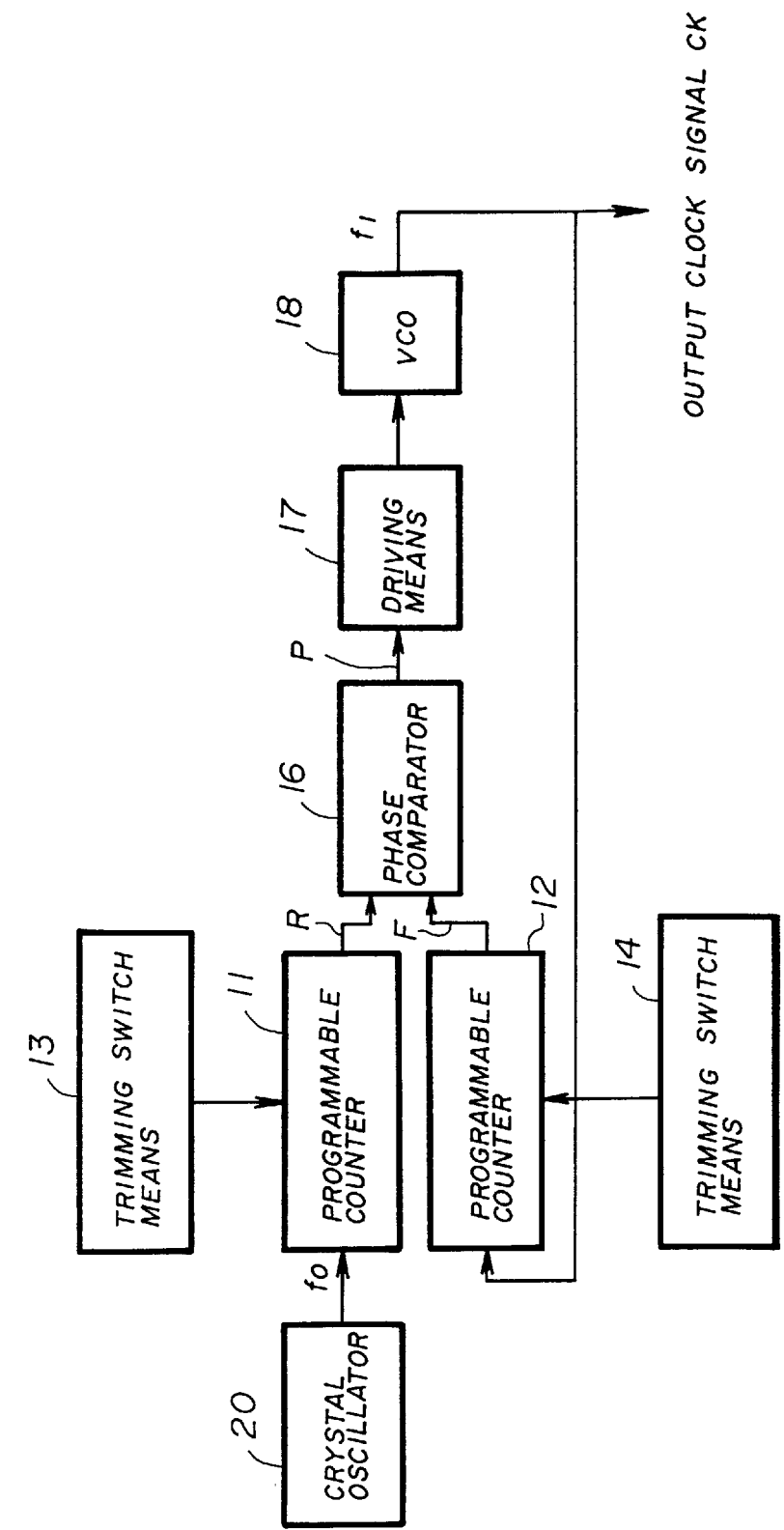
FIG. 3 shows a block diagram of a clock generator in one embodiment of the present invention.

FIG. 3 shows a block diagram of a clock generator in one embodiment of the present invention.

As shown in the figure, the clock generator 1 includes a crystal oscillator 20, programmable counters 11, 12, and a VCO (Voltage Controlled Oscillator) 18. The clock oscillator 20 generates a reference clock signal. The programmable counter 11 performs frequency dividing on the reference clock signal and outputs a reference signal R. The output frequency of the VCO 18 is changeable by input voltage control. The VCO 18 provides an output clock signal CK. The programmable counter 12 performs frequency dividing on this output clock signal CK and outputs a feedback signal F.

The clock generator 1 further includes a phase comparator 16 and a driving means 17. The phase comparator 16 compares the phases of the reference signal R and feedback signal F output from the programmable counters 11 and 12, respectively, with one another. Thus, the phase comparator 16 detects the phase difference between these phases, and outputs a phase difference signal P based on the detected phase difference. The driving means 17 generates a signal to be provided to the VCO 18 based on the phase difference signal P, and performs filtering on the generated signal. The driving means 17 includes a charge pump and a loop filter.

The clock generator 1 further includes trimming switch means 13 and 14. The trimming switch means 13 determines the frequency dividing ratio of the programmable counter 11 by trimming. The trimming switch means 14 determines the frequency dividing ratio of the programmable counter 12 by trimming.

A main operation of the clock generator 1 will now be described.

When the phase of the output of the programmable counter 12 delays from the phase of the output of the programmable counter 11, the phase comparator 16 sends a delay signal (the phase difference signal P) to the driving means 17. Thereby, the driving means 17 raises the voltage to be applied to the VCO 18. As a result, the output frequency of the VCO 18 increases.

When the phase of the output of the programmable counter 12 advances from the phase of the output of the programmable counter 11, the phase comparator 16 sends an advance signal (the phase difference signal P) to the driving means 17. Thereby, the driving means 17 lowers the voltage to be applied to the VCO 18. As a result, the output frequency of the VCO 18 decreases.

When the phase of the output of the programmable counter 12 is coincident with the phase of the output of the programmable counter 11, the phase comparator 16 sends a phase coincident signal (the phase difference signal P) to the driving means 17. Thereby, the driving means 17 fixes the voltage to be applied to the VCO 18. As a result, the output frequency of the VCO 18 is fixed.

In the above-described operation, the frequency $f_1$ of the output clock signal CK output from the clock generator can be set as follows:

$$f_1 = f_0 \times N/M$$

where $f_0$ represents the frequency of the above-mentioned reference clock signal, M represents the frequency dividing ratio of the programmable counter 11 and N represents the frequency dividing ratio of the programmable counter 12.

In the clock generator 1 in the embodiment of the present invention, the frequency dividing ratios of the programmable counters 11 and 12 are fixed by circuits which are determined by the trimming switch means 13 and 14, respectively. It is also possible that the frequency dividing ratio of only the programmable counter 11 is fixed by a circuit which is determined by the trimming switch means 13, and the frequency dividing ratio of the programmable counter 12 is originally fixed. Similarly, it is also possible that the frequency dividing ratio of only the programmable counter 12 is fixed by a circuit which is determined by the trimming switch means 14, and the frequency dividing ratio of the programmable counter 11 is originally fixed.

Trimming is performed on the trimming switch means 13 and/or trimming switch means 14. Thereby, the circuit(s) formed by the trimming switch means 13 and/or trimming switch means 14 and the programmable counter 11 and/or the programmable counter 12 is (are) freely set. Thereby, the frequency dividing ratio(s) of the programmable counter 11 and/or the programmable counter 12 is set appropriately, and thus, the output clock signal CK of a desired frequency $f_1$, can be obtained.

The above-mentioned circuit setting by trimming of the trimming switch means 13 and/or trimming switch means 14 can be performed at any time after the wafer process, as an initial setting (in a step of shipping products from a factory).

Figure 4:
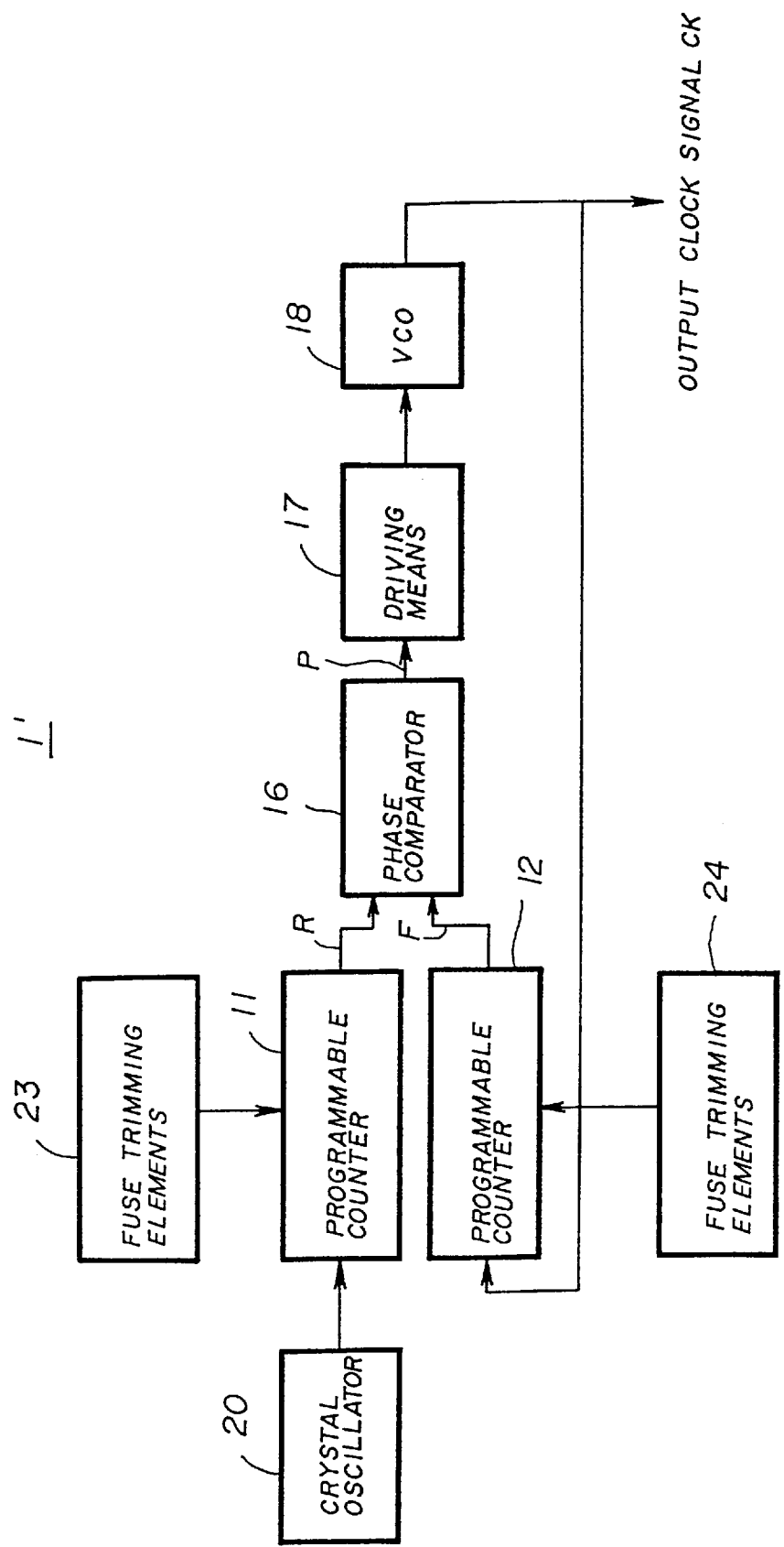
FIG. 4 shows a block diagram of one example of the clock generator in the embodiment of the present invention.

Such a trimming switch means can be fuse trimming elements (such as fuse trimming elements 23 and 24 shown in FIG.4). The fuse trimming elements have a fuse array built therein. The fuse trimming elements are mounted on a wafer together with the other portions of the clock generator. The fuse array has a terminal for each fuse element of the fuse array. Via the terminal, a predetermined current is supplied externally to the fuse which is thus cut by fusion.

Thus, necessary fuses are left and unnecessary fuses are cut by the fusion. Thus, trimming is performed, and a desired circuit(s) is (are) formed by the fuse trimming elements 23 and/or fuse trimming elements 24 and the programmable counter 11 and/or the programmable counter 12.

Figure 5:
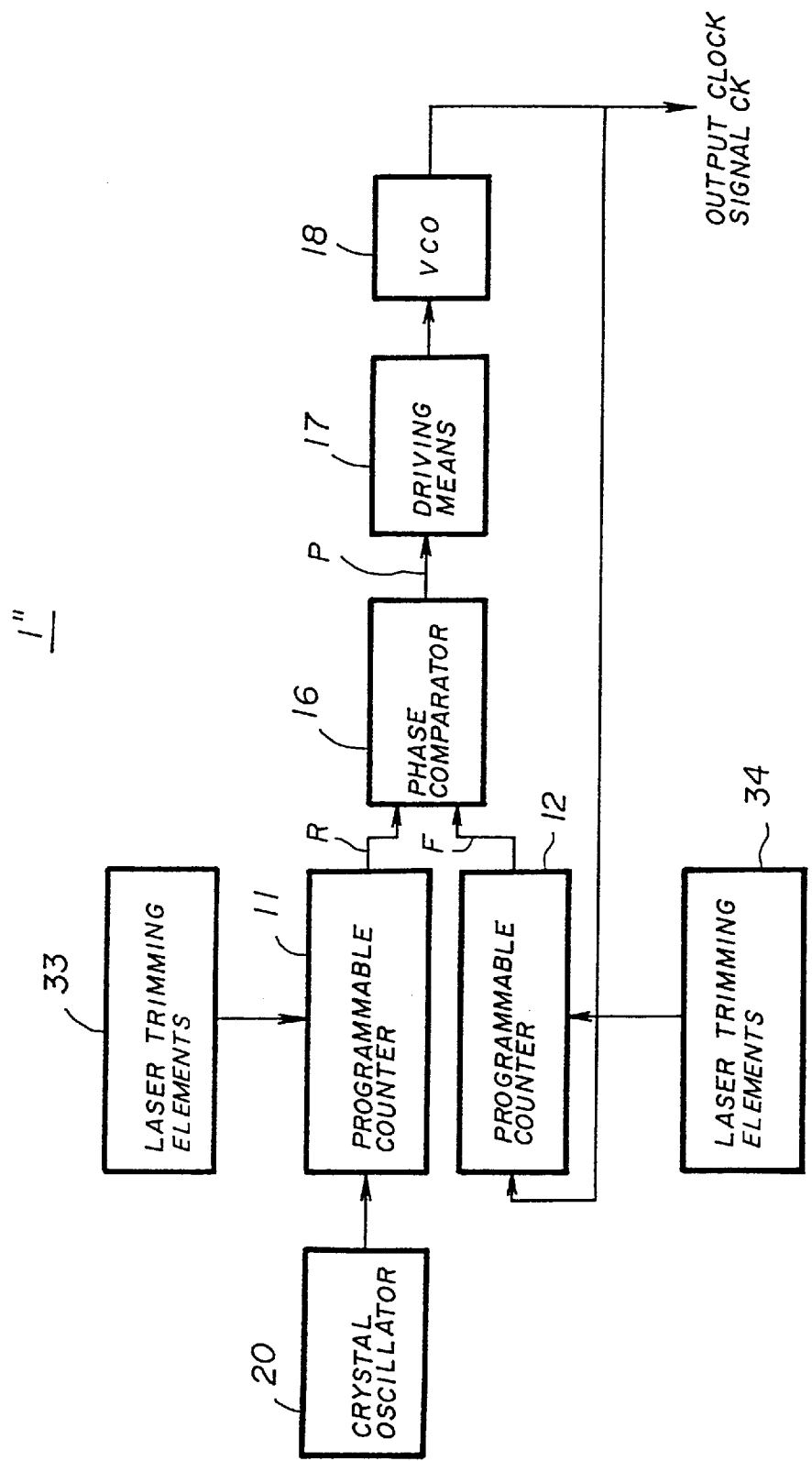
FIG. 5 shows a block diagram of another example of the clock generator in the embodiment of the present invention.

Such a trimming switch means can also be laser trimming elements (such as laser trimming elements 33 and 34 shown in FIG.5). The laser trimming elements have a switching array built therein. The laser trimming elements are mounted on a wafer together with the other portions of the clock generator. Necessary elements of the switching array are left and unnecessary elements of the switching array are cut by a laser beam externally. Thus, trimming is performed, and a desired circuit(s) is (are) formed by the laser trimming elements 33 and/or laser trimming elements 34 and the programmable counter 11 and/or the programmable counter 12.

As disclosed in U.S. Pat. No. 5,244,836, metallic fusible links may be used as programming elements for PLD, PROM and so forth. Certain metallic fusible links are cut by fusion as a result of causing a high current to flow therethrough. Thus, programming (forming a desired circuit) is performed. In PLD, PROM or the like, terminals for programming are provided on a finished product. A high current is caused to flow through certain metallic fusible links via these terminals, and thus, programming of the PLD, PROM or the like is performed. As a variant of this method, programming terminals are provided, with which contact is possible only during a wafer test process before the IC is sealed in a package but is not possible after the IC is sealed in the package. By causing a high current to flow through certain fuses via these programming terminals, programming of the IC is performed during the wafer test process. In the present application, this method is referred to as 'fuse trimming'.

Further, as disclosed in U.S. Pat. No. 5,641,701, fuses are provided in an IC, and a laser beam is used for trimming the fuses (cutting certain fuses) during an IC process before the IC is sealed in a package. Thus, the IC is programmed. In the present application, this method is referred to as 'laser trimming'.

As mentioned above, the trimming switch means is (are) mounted on a wafer together with the other portions of the clock generator. Thereby, by trimming, a desired circuit(s) is (are) easily formed for fixing the frequency dividing ratio(s) of the programmable counter 11 and/or the programmable counter 12. After the circuit(s) is (are) once formed, it is not necessary to provide a signal(s) so as to fix the frequency dividing ratio(s) of the programmable counter 11 and/or the programmable counter 12. In the related art, in a case of using an EEPROM(s) or a ROM(s), it is necessary to provide a signal(s) so as to program (determine the circuit (s)) the memory (memories) in order to fix the frequency dividing ratio(s) of the programmable counter 11 and/or the programmable counter 12. In this case, a circuit forming error due to a control system failure may occur. In the embodiment of the present invention, such a problem is solved.

In the present invention, any trimming can be used. Accordingly, the circuit(s) can be freely set.

Further, extra terminals, which are necessary for the arrangement in the related art using the memory (memories) for inputting the signal(s) externally, are not needed in the present invention. Thereby, the IC chip can be miniaturized.

Further, in a method of manufacturing the clock generator in the present invention, after the wafer process in which each portion, mentioned above, of the clock generator is mounted on a wafer, trimming of the trimming switch means is performed.

Accordingly, the trimming work can be performed after the completion of the wafer process. As a result, in comparison to the method using mask ROM(s), the clock generator IC manufacturing process can be shortened.

Further, because the trimming operation is easy, it is possible to increase productivity. Thereby, low-cost high-performance clock generator ICs can be manufactured.

Figure 6:
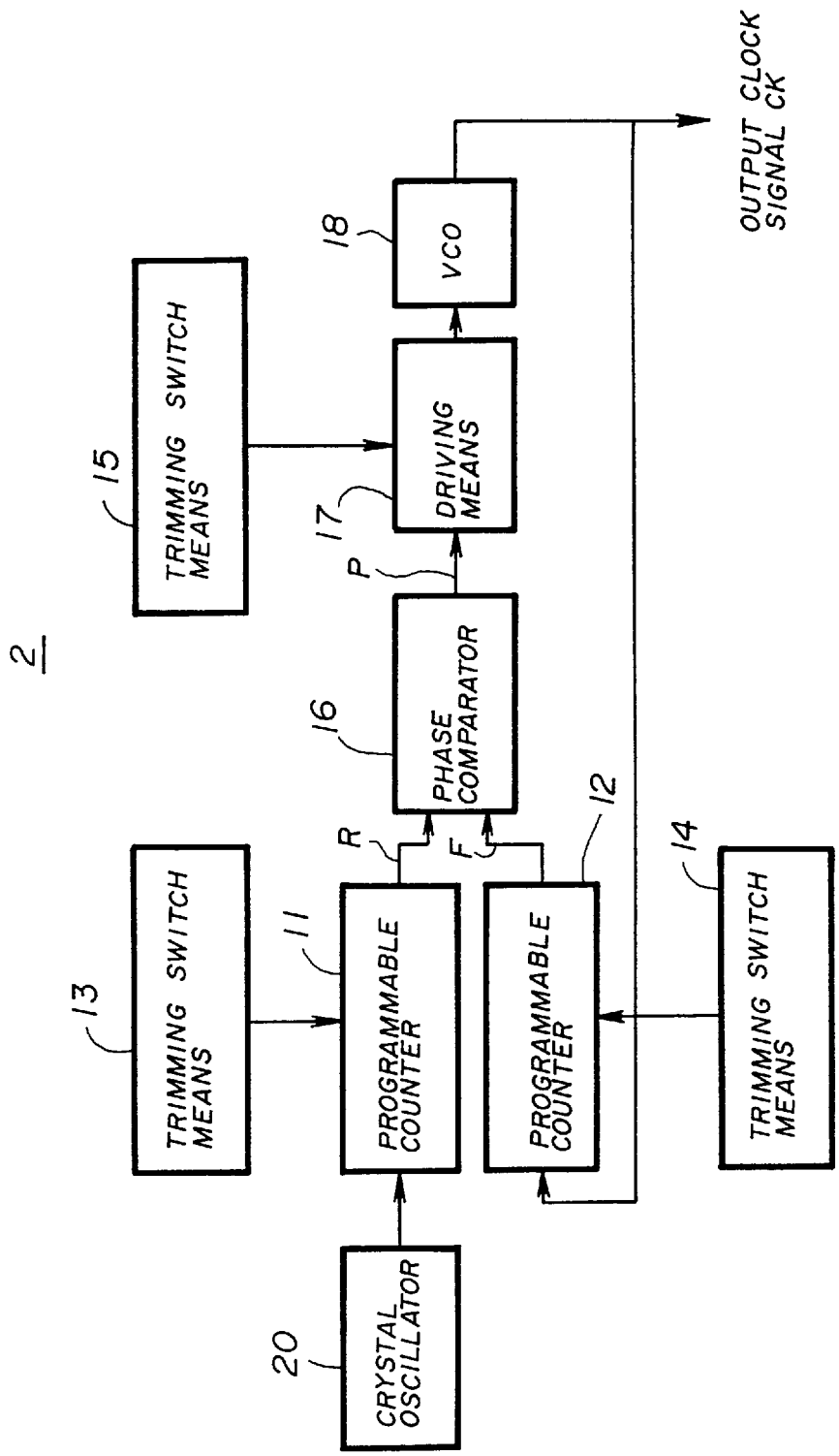
FIG. 6 shows a block diagram of a clock generator in another embodiment of the present invention.

It is also possible to perform a slight adjustment of an analog circuit such as the loop filter and so forth by performing trimming such as fuse trimming and laser trimming on a trimming switch means 15, shown in FIG. 6, after the wafer process. Thereby, it is also possible to perform a slight adjustment of an analog circuit such as the loop filter and so forth while examining characteristics of the IC formed on the wafer. Thereby, such a slight adjustment can be freely performed.

Further, the present invention is not limited to the above-described embodiments, and variations and modifications may be made without departing from the claimed scope of the present invention.

What is claimed is:

1. A clock-generator comprising:
   a reference clock signal oscillator for generating a reference clock signal;
   a first frequency divider for performing frequency dividing on the reference clock signal and outputting a reference signal resulting from the frequency dividing;
   a frequency controllable oscillator for generating an output clock signal, the frequency of which is controllable;
   a second frequency divider for performing frequency dividing on the output clock signal and outputting a feedback signal resulting from the frequency dividing; and
   a phase comparator for comparing the reference signal and the feedback signal, and outputting a phase difference signal based on the phase difference between the phases of the reference signal and the feedback signal,
   wherein, when the phase of the feedback signal delays from the phase of the reference signal, the phase difference signal is such that said frequency controllable oscillator increases the frequency of the output clock signal in accordance with the phase difference signal, and, when the phase of the feedback signal advances from the phase of the reference signal, the phase difference signal is such that said frequency controllable oscillator decreases the frequency of the output clock signal in accordance with the phase difference signal,
   said clock generator further comprising trimming elements which determine, by trimming, the frequency dividing ratio of at least one of said first and second frequency dividers.

2. A clock generator comprising:
   reference clock signal oscillating means for generating a reference clock signal;
   first frequency dividing means for performing frequency dividing on the reference clock signal and outputting a reference signal resulting from the frequency dividing;
   frequency controllable oscillating means for generating an output clock signal, the frequency of which is controllable;
   second frequency dividing means for performing frequency dividing on the output clock signal and outputting a feedback signal resulting from the frequency dividing; and
   phase comparing means for comparing the reference signal and the feedback signal, and outputting a phase difference signal based on the phase difference between the phases of the reference signal and the feedback signal,
   wherein, when the phase of the feedback signal delays from the phase of the reference signal, the phase difference signal is such that said frequency controllable oscillating means increases the frequency of the output clock signal in accordance with the phase difference signal, and, when the phase of the feedback signal advances from the phase of the reference signal, the phase difference signal is such that said frequency controllable oscillating means decreases the frequency of the output clock signal in accordance with the phase difference signal,
   said clock generator further comprising trimming means which determines, by trimming, the frequency dividing ratio of at least one of said first and second frequency dividing means.

3. A clock generator comprising:
   a reference clock signal oscillator for generating a reference clock signal;
   a first programmable counter for performing frequency dividing on the reference clock signal and outputting a reference signal resulting from the frequency dividing;
   a voltage controlled oscillator for generating an output clock signal, the frequency of which is controllable by input voltage control;
   a second programmable counter for performing frequency dividing on the output clock signal and outputting a feedback signal resulting from the frequency dividing; and
   a phase comparator for comparing the reference signal and the feedback signal, and outputting a phase difference signal based on the phase difference between the phases of the reference signal and the feedback signal,
   driving means including a charge pump and a loop filter, for generating a signal to be applied to said voltage controlled oscillator based on the phase difference signal and performing filtering on the signal to be applied to said voltage controlled oscillator; and
   at least one trimming switch means for determining, by trimming, the frequency dividing ratio of at least one of said first and second programmable counters.

4. The clock generator according to claim 3, wherein said at least one trimming switch means comprises fuse trimming elements.

5. The clock generator according to claim 3, wherein said at least one trimming switch means comprises laser trimming elements.

6. A clock generator manufacturing method comprising the steps of:
   a) forming, on a wafer, a first programmable counter for performing frequency dividing on a reference clock signal generated by a reference clock signal oscillator, a first trimming switch means for determining, by trimming, the frequency dividing ratio of said first programmable counter, a voltage controlled oscillator for generating an output clock signal, the frequency of the output clock signal being controllable by input voltage control, a second programmable counter for performing frequency dividing on the output clock signal, a second trimming switch means for determining, by trimming, the frequency dividing ratio of said second programmable counter, a phase comparator for comparing the outputs of said first and second programmable counters and generating a phase difference signal, a charge pump for generating a voltage to be applied to said voltage controlled oscillator based on the phase difference signal, and performing filtering on the voltage to be applied to said voltage controlled oscillator; and b) performing the trimming of said first and second trimming switch means after said step a).

* * * * *

UNITED STATES PATENT AND TRADEMARK OFFICE
CERTIFICATE OF CORRECTION

PATENT NO. : 5,877,657
DATED      : March 2, 1999
INVENTOR(S): Masanori Yoshinaka It is certified that error appears in the above-identified patent and that said Letters Patent is hereby corrected as shown below:

Cover page, Item [22], please change "Nov. 12, 1997" to -- Nov. 26, 1997--

Signed and Sealed this

Seventeenth Day of August, 1999

Attest:

Q. TODD DICKINSON

*Attesting Officer*                *Acting Commissioner of Patents and Trademarks*